(12) United States Patent
Kobayashi et al.

(10) Patent No.: US 8,604,347 B2
(45) Date of Patent: Dec. 10, 2013

(54) BOARD REINFORCING STRUCTURE, BOARD ASSEMBLY, AND ELECTRONIC DEVICE

(75) Inventors: Hiroshi Kobayashi, Kawasaki (JP); Satoshi Emoto, Kawasaki (JP); Masayuki Kitajima, Kawasaki (JP); Toru Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 13/075,895

(22) Filed: Mar. 30, 2011

(65) Prior Publication Data
US 2011/0303441 A1  Dec. 15, 2011

(30) Foreign Application Priority Data
Jun. 10, 2010  (JP) ................. 2010-133372

(51) Int. Cl.
*H05K 1/03* (2006.01)
*H05K 7/00* (2006.01)
*H01L 23/58* (2006.01)

(52) U.S. Cl.
USPC ................... 174/255; 257/636; 361/760

(58) Field of Classification Search
USPC .......... 174/255, 260; 257/619, 625, 632, 633, 257/636, 667, 668, 669, 796, E23.126; 361/760, 762
See application file for complete search history.

(56) References Cited

U.S. PATENT DOCUMENTS

| | | | | |
|---|---|---|---|---|
| 5,834,848 A | * | 11/1998 | Iwasaki | ............ 257/778 |
| 6,518,666 B1 | | 2/2003 | Ikeda | |
| 7,053,493 B2 | * | 5/2006 | Kanda et al. | ............ 257/783 |
| 2001/0004313 A1 | * | 6/2001 | Yamaoka | ............ 361/704 |
| 2002/0007964 A1 | | 1/2002 | Mori et al. | |
| 2006/0169488 A1 | | 8/2006 | Kaji | |
| 2007/0063324 A1 | | 3/2007 | Mishiro et al. | |
| 2010/0061065 A1 | | 3/2010 | Hayashiyama | |

FOREIGN PATENT DOCUMENTS

| | | |
|---|---|---|
| EP | 1 534 052 A2 | 5/2005 |
| JP | 02-079450 | 3/1990 |
| JP | 10-056110 | 2/1998 |
| JP | 10-150117 | 6/1998 |
| JP | 11-040687 | 2/1999 |

(Continued)

OTHER PUBLICATIONS

English Machine Translation of JP 10-150117A provided with Office Action.*

(Continued)

*Primary Examiner* — Chau Nguyen
*Assistant Examiner* — Roshn Varghese
(74) *Attorney, Agent, or Firm* — Squire Sanders (US) LLP

(57) ABSTRACT

Disclosed is a board reinforcing structure for reinforcing a circuit board in which an electronic component is mounted on a first surface, the electronic component having an electrode arranged in a rectangular-shaped region on the first surface. The board reinforcing structure includes a reinforcing member bonded to positions corresponding to corner parts of four corners of the rectangular-shaped region on a second surface provided on a side opposite to the first surface of the circuit board. In the board reinforcing structure, corresponding one of notches is formed in the reinforcing member at a position corresponding to one of the corner parts of the four corners of the rectangular-shaped region, and at least two apexes of the reinforcing member directed to an outside are formed to shape a contour thereof with the one of the notches.

17 Claims, 13 Drawing Sheets

(56) References Cited

FOREIGN PATENT DOCUMENTS

| | | |
|---|---|---|
| JP | 2000-151083 A | 5/2000 |
| JP | 2000-216298 A | 8/2000 |
| JP | 2000-294721 A | 10/2000 |
| JP | 2007-88293 | 4/2007 |

OTHER PUBLICATIONS

European Search Report application No. 11160471.6 dated Nov. 4, 2011.

Chinese Office Action application No. 201110078526.8 dated Mar. 28, 2013.

* cited by examiner

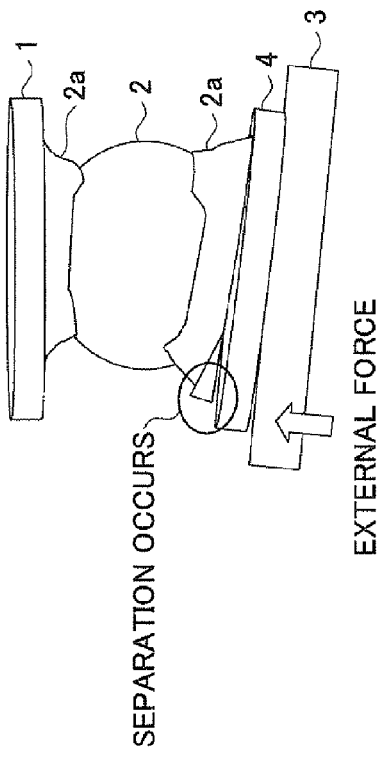
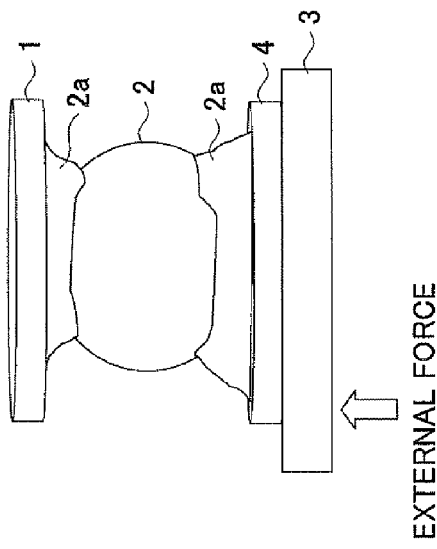
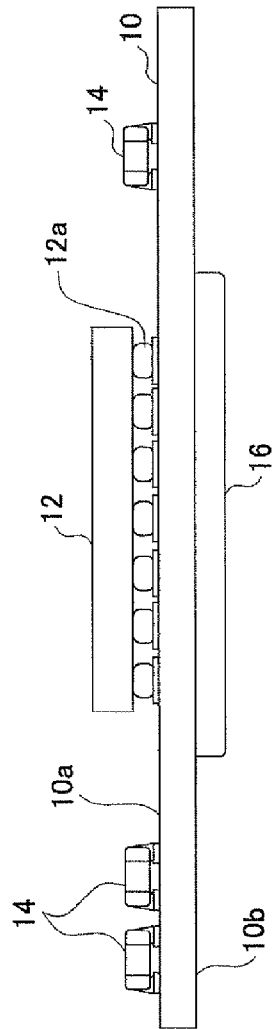

FIG.12

| No. | REINFORCING SHAPE | MATERIAL | RESULT [N/mm²] |
|---|---|---|---|
| 1 | NONE | NONE | 500 |
| 2 | UNDERFILL | RESIN | 38.5 |
| 3 | SQUARE | METAL | 30 |
| 4 |  | RESIN | 160 |
| 5 | CROSS | METAL | 50 |
| 6 |  | RESIN | 200 |
| 7 FOR COMPARISON (SEE FIG. 13) | SIMPLE RECTANGLE HAVING NO MOUNTAIN PARTS (FOUR CORNERS) | METAL | 100 |
| 8 (SEE FIG. 4) | SOLID HAVING NOTCHES (REINFORCING PLATE SIMILAR IN SIZE TO BGA) | METAL | 18.5 |
| 9 (SEE FIG. 9) | SQUARE HAVING NOTCHES | METAL | 28 |
| 10 (SEE FIG. 8) | REINFORCING MEMBERS EACH HAVING NOTCH (NOTCH HAVING LENGTH OF 3 MM, REINFORCING MEMBERS EACH HAVING WIDTH OF 3 MM) (FOUR CORNERS) | METAL | 60 |

BOARD REINFORCING STRUCTURE, BOARD ASSEMBLY, AND ELECTRONIC DEVICE

CROSS-REFERENCE TO RELATED APPLICATION

This application is based upon and claims the benefit of priority of Japanese Patent Application No. 2010-133372, filed on Jun. 10, 2010, the entire contents of which are incorporated herein by reference.

FIELD

The embodiment discussed herein is related to aboard reinforcing structure for reinforcing aboard on which an electronic component is mounted.

BACKGROUND

Up until now, there has been discussed reducing the warpage of a board at the time of soldering electronic components to the board in order to realize excellent soldering, high-density mounting, reliability, or the like. Further, there has been discussed providing a semiconductor device improved in mounting yield and connection reliability or the like. Further, there has been discussed suppressing the deformation of a circuit board and enhancing the performance and reliability of a hybrid integrated circuit. Further, there has been discussed providing a plastic package for a semiconductor that realizes its lightweight and thinning and reduces its warpage due to a change in temperature. Further, there has been discussed providing a tape type ball grid array semiconductor device capable of improving the reliability of connection by solder balls and reducing distortion generated on the solder balls according to a method in which a difference in thermal expansion between a tape type wiring board and an external board when a semiconductor package is heated is decreased and the generation of the warpage of the tape type wiring board is suppressed.

Patent Document 1: Japanese Laid-open Patent Publication No. 2007-88293
Patent Document 2: Japanese Laid-open Patent Publication No. 11-40687
Patent Document 3: Japanese Laid-open Patent Publication No. 02-079450
Patent Document 4: Japanese Laid-open Patent Publication No. 10-56110
Patent Document 5: Japanese Laid-open Patent Publication No. 10-150117

SUMMARY

According to an aspect of the present invention, there is provided a board reinforcing structure for reinforcing a circuit board in which an electronic component is mounted on a first surface, the electronic component having an electrode arranged in a rectangular-shaped region on the first surface. The board reinforcing structure includes a reinforcing member bonded to positions corresponding to corner parts of four corners of the rectangular-shaped region on a second surface provided on a side opposite to the first surface of the circuit board. In the board reinforcing structure, corresponding one of notches is formed in the reinforcing member at a position corresponding to one of the corner parts of the four corners of the rectangular-shaped region, and at least two apexes of the reinforcing member directed to an outside are formed to shape a contour thereof with the one of the notches.

According to another aspect of the present invention, there is provided a board assembly including a circuit board having a first surface and a second surface provided on a side opposite to the first surface; an electronic component having an electrode arranged in a rectangular-shaped region and mounted with the electrode bonded to a connection terminal of the circuit board; and a reinforcing member bonded to the second surface of the circuit board. In the board assembly, the reinforcing member is bonded to positions corresponding to corner parts of four corners of the rectangular-shaped region on the second surface of the circuit board, the reinforcing member has corresponding one of notches at a position corresponding to one of the corner parts of the four corners of the rectangular-shaped region, and at least two apexes of the reinforcing member directed to an outside are formed to shape a contour thereof with the one of the notches.

The object and advantages of the present invention will be realized and attained by means of the elements and combinations particularly pointed out in the claims.

It is to be understood that both the foregoing general description and the following detailed description are exemplary and explanatory and are not restrictive of the present invention, as claimed.

BRIEF DESCRIPTION OF DRAWINGS

FIGS. 1A and 1B are views illustrating the deformation of a solder bump when an external force is applied to a solder bump bonding part as a mounting structure;

FIG. 2 is a side view of a board assembly in which a circuit board is reinforced from its rear side;

FIG. 12 is a table illustrating the results of structure simulations;

DESCRIPTION OF EMBODIMENTS

Figure 3:
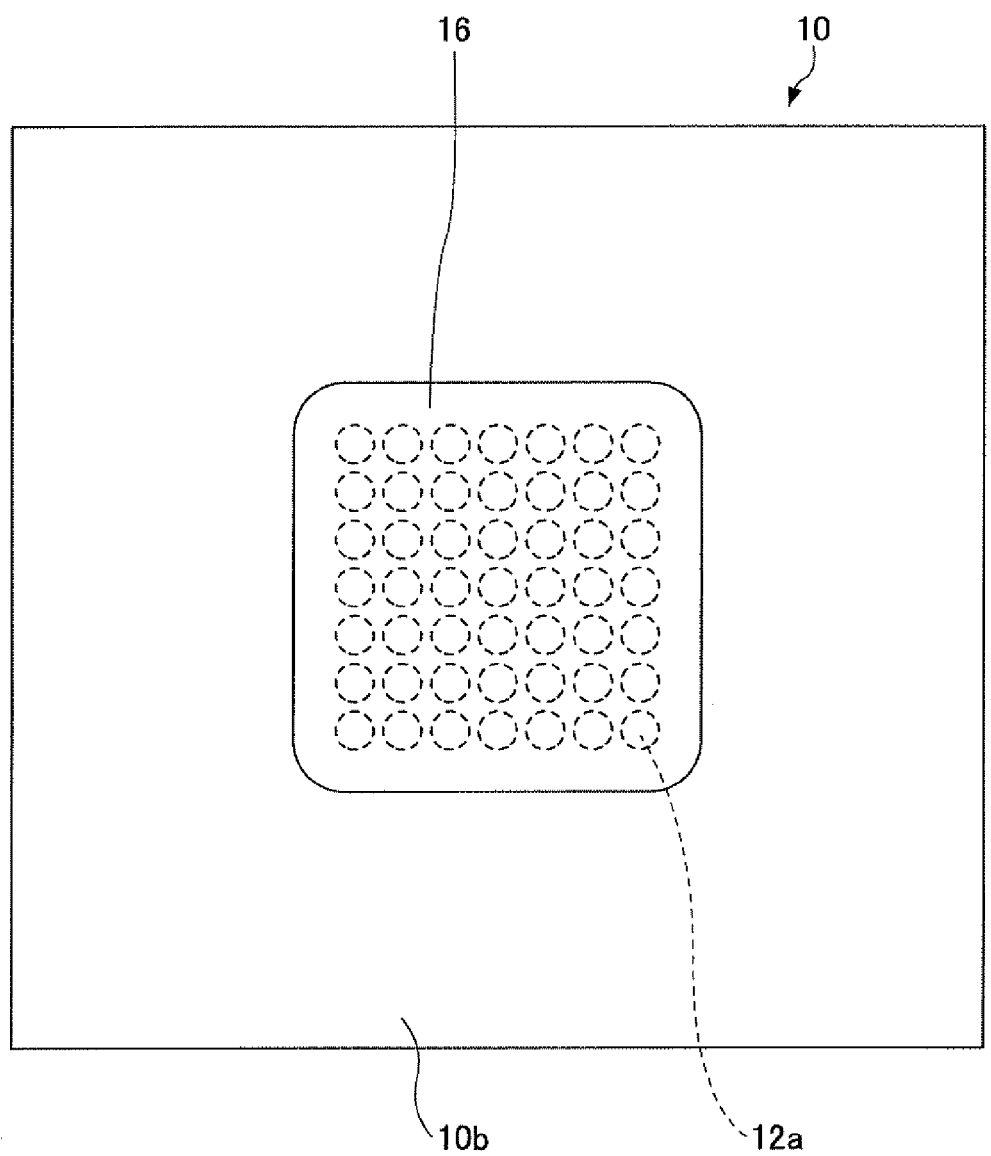
FIG. 3 is a plan view illustrating the rear surface of the board assembly illustrated in FIG. 2.

Generally, electronic devices incorporate a circuit board on which electronic components such as semiconductor devices are mounted. With recent progress in the miniaturization of the electronic devices, the circuit board incorporated into the electronic devices has been miniaturized by high density mounting, and the electronic components such as the semiconductor devices mounted on the circuit board have been also miniaturized. Accordingly, mounting structures for mounting the electronic components on the circuit board have been also miniaturized.

As bonding members for mounting the semiconductor devices on the circuit board, solder bumps are often used. Solder bonding using the solder bumps provides electrical connections and mechanically fixes the semiconductor devices to the circuit board. Where the mounting structures are miniaturized as described above and the solder bumps are made small, solder bonding parts are also made small. Therefore, the solder bump bonding parts are easily deformed and damaged due to thermal stress and external pressure, which results in poor connections being prone to occur.

Here, referring to FIGS. 1A and 1B, a description is made of the deformation of a solder bump when an external force is applied to a solder bump bonding part as a mounting structure. FIG. 1A illustrates a mounting structure in which an electrode pad 1 of a semiconductor device is bonded to a connection pad 4 of a circuit board 3 by a solder bump 2. The solder bump 2 is melted and solidified at the time of solder reflow, so that solder bonding parts 2a in close contact with the electrode pad 1 and the connection pad 4 are formed. FIG. 1A illustrates a state in which an external force is not applied to the solder bump 2 and the solder bump 2 is not deformed.

When an external force is applied to a part of the circuit board 3 as illustrated in FIG. 1A, the circuit board 3 is deformed in such a manner as to raise a part corresponding to where the external force is applied while the solder bump 2 is also deformed as illustrated in FIG. 1B. Since the part to which the external force is applied is away from the center of the solder bump 2, stress is excessively applied to the end of the solder bonding part 2a on the side closer to the part to which the external force is applied. When the application of the external force is stopped, the stress is also no longer applied. As a result, the solder bump 2 becomes free from its deformed state and restores its original shape illustrated in FIG. 1A.

If such an external force is repeatedly applied to the circuit board 3, the stress is repeatedly excessively applied between the solder bonding part 2a and the connection pad 4, which in turn may separate the end of the solder bonding part 2a from the connection pad 4. Further, if the separation of the end of the solder bonding part 2a is transmitted into the solder bonding part 2a and the connection pad 4, an electrical connection between the solder bonding part 2a and the connection pad 4 is lost, which results in the occurrence of a poor connection.

In view of the above problems, there has been employed a method of filling an underfill material between mounted semiconductor devices and a circuit board to reinforce solder bonding parts. In other words, the underfill material formed of an epoxy resin or the like is filled around the solder bonding parts to be reinforced at their peripheries, and the bottom surfaces of the semiconductor devices and the front surface of the circuit board are bonded together by the underfill material so as to be mechanically fixed. Thus, the pressure resistance and long-term reliability of the solder bonding parts are improved.

Meanwhile, with recent progress in the miniaturization and functional capability of, particularly, electronic devices such as mobile computers including notebook computers and mobile phones, pressure applied to the housings of the electronic devices is easily transmitted to their inner circuit boards and mounting structures. Therefore, in order to further improve the pressure resistance and long-term reliability of solder bonding parts, an underfill material having increased bonding strength and a higher Young's modulus is used. However, if the bonding strength of the underfill material increases, it becomes difficult to remove semiconductor devices fixed by the underfill material from a circuit board.

For example, if a malfunction occurs in semiconductor devices after the semiconductor devices have been mounted on a circuit board, it is not possible to remove and replace only the semiconductor device in which the malfunction occurs from the circuit board. Accordingly, the expensive circuit board must be replaced in its entirety, which results in an increase in spoilage cost of the circuit board. In addition, it is not possible to examine the functions of only the semiconductor device assumed to have the malfunction and analyze a reason for the malfunction. Therefore, the reason for the malfunction cannot be determined, which in turn may increase a defective fraction.

In small portable electronic devices, a circuit board is easily deformed due particularly to external pressure. Therefore, stress caused by the deformation of the circuit board is likely to be transmitted to the mounting structure of semiconductor devices. In view of this problem, there has been proposed reinforcing a circuit board to prevent the circuit board from being easily deformed so that the pressure resistance and long-term reliability of the mounting structure of solder bonding parts or the like are improved. In other words, there has been proposed bonding a warpage reduction member by solder on the rear side of the circuit board on which semiconductor devices are mounted to reinforce parts corresponding to the semiconductor devices mounted on the circuit board (see, for example, Patent Document 1).

Further, there has been proposed incorporating a reinforcing member in semiconductor devices to prevent the semiconductor devices from being easily deformed to reinforce a circuit board and a mounting structure with the semiconductor devices themselves (see, for example, Patent Documents 2 through 4). Furthermore, there has been proposed forming notches in corner parts at the outer peripheries of semiconductor devices to reduce warpage due to a difference in thermal stress (see, for example, Patent Document 5).

The warpage reduction member disclosed in Patent Document 1 is effective at reducing warpage due to thermal stress. However, if an external force is applied to the circuit board, stress is transmitted to the solder bonding parts via the circuit board and particularly excessively applied to the corner parts of the warpage reduction member, which results in the occurrence of a poor connection between the bonding parts. For this reason, the warpage reduction member disclosed in Patent Document 1 is not particularly suitable for a portable electronic device to which an external force is easily transmitted.

The mounting structure disclosed in each of Patent Documents 2 through 4 is directed to reinforcing the semiconductor devices so as not to be easily deformed but not directed to relaxing stress caused when the circuit board is deformed due to an external stress. Therefore, bonding parts between the circuit board and the semiconductor devices and the mounting structure cannot be reinforced.

The semiconductor devices disclosed in Patent Document 5 are directed to forming the cutouts in the corner parts of the semiconductor devices to reduce the warpage of the semiconductor device but not effective at reducing the warpage of a circuit board. Therefore, bonding parts between the circuit board and the semiconductor devices and a mounting structure cannot be reinforced.

In Patent Documents 1, 2, 4, and 5, an underfill material is finally filled between the semiconductor devices and the circuit board to bond and fix the semiconductor devices to the circuit board. Therefore, although the bonding parts of the semiconductor devices can be reinforced, no consideration is given to easily separating the mounted semiconductor devices from the circuit board.

Next, an embodiment of the present invention is described with reference to the accompanying drawings.

First, a description is made of a basic structure for reinforcing a board on which semiconductor devices are mounted. FIG. 2 is a side view of a board assembly in which a circuit board is reinforced from its rear side. FIG. 3 is a plan view illustrating the rear surface of the board assembly.

The circuit board 10 is a printed circuit board in which a circuit and connection electrodes are formed by copper patterns on aboard formed of a glass epoxy resin or the like. On a front surface (first surface) 10a of the circuit board 10, semiconductor devices 12 as electronic components are mounted and passive elements 14 such as capacitors and resistance elements are mounted around the semiconductor devices 12. The semiconductor devices 12 are formed into a so-called BGA package: the semiconductor devices 12 are formed on electrodes and flip-chip-mounted on the connection electrodes of the circuit board 10 by plural solder pumps 12a.

On a rear surface (second surface) 10b of the circuit board 10, a reinforcing member 16 is bonded. The reinforcing member 16 is a plate-shaped member formed of, for example, metal or a ceramic material having strength greater than that of the material of the circuit board 10. The reinforcing member 16 is bonded to the circuit board 10 by a resin adhesive. Alternatively, with copper patterns formed on the rear surface 10b of the circuit board 10, the reinforcing member 16 may be bonded to the circuit board 10 by a bonding material such as solder.

As illustrated in FIG. 2, the reinforcing member 16 is built in a size covering the entirety of the mounted semiconductor device 12 and entirely reinforces amounted region where the semiconductor device 12 is mounted. The circuit board 10 is not likely to be deformed due to the bonded reinforcing member 16 even if an external force is applied to the circuit board 10. Consequently, stress caused in the bonding parts (mounting structures formed by solder bumps 12a) of the semiconductor device 12 is reduced and relaxed.

Here, if an external force is applied outside the mounted region of the circuit board 10, the external force is transmitted to the mounted region as stress inside the circuit board 10. The stress transmitted to the mounted region is first transmitted to the periphery of a part where the reinforcing member 16 is mounted. Where the reinforcing member 16 is a rectangle as illustrated in FIG. 2, the stress is intensively applied to four corners at the periphery of the rectangle. Consequently, the stress is intensively applied to the bonding parts (solder bumps 12a) closest to the corner parts of the four corners of the rectangle.

Figure 4:
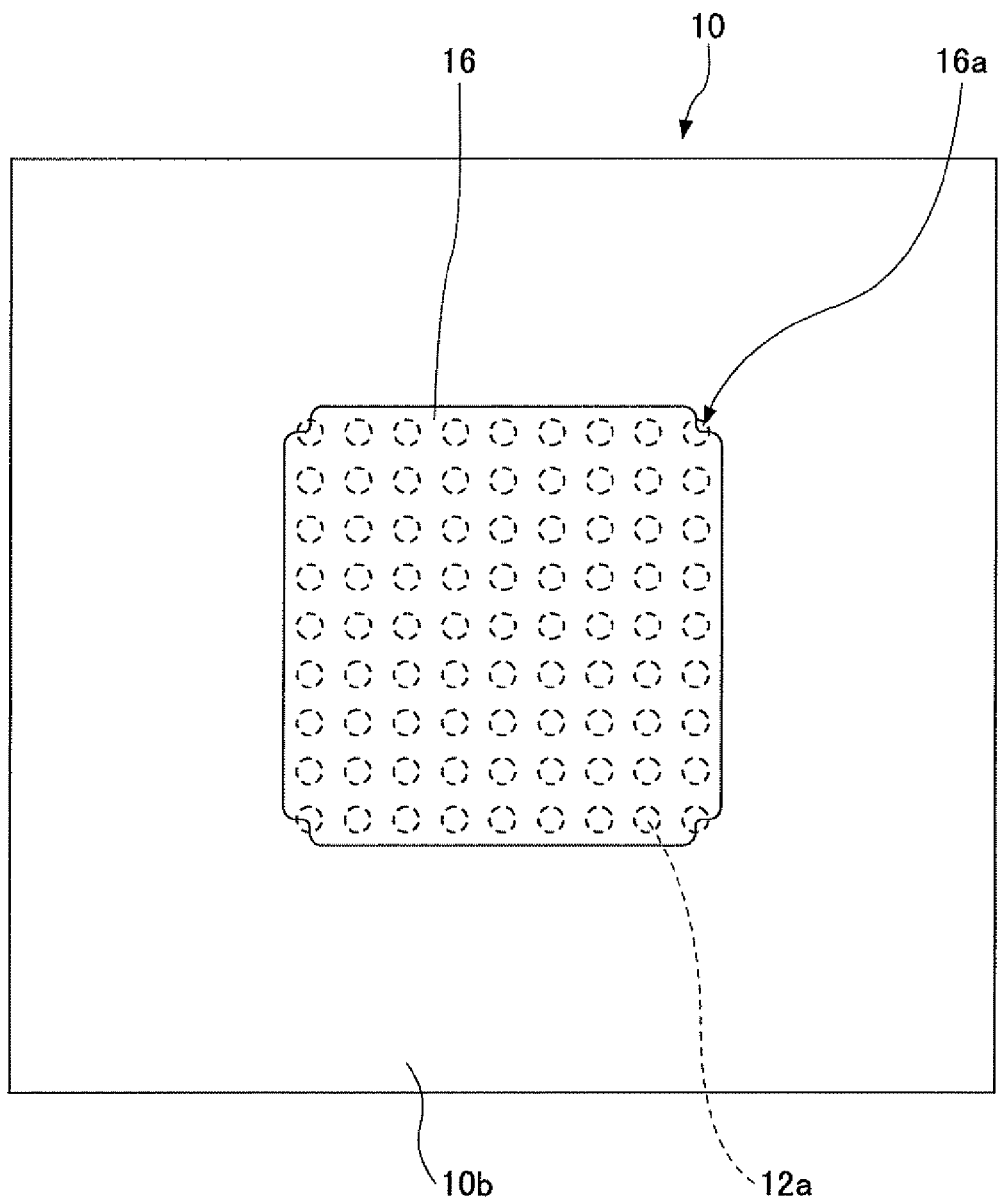
FIG. 4 is a plan view illustrating the rear surface of the board assembly provided with a reinforcing member having notches at its corner parts of four corners.

Accordingly, as illustrated in FIG. 4, notches 16a, which are provided at the parts (corner parts of the four corners) of the reinforcing member 16 where the stress is intensively applied, can disperse the stress intensively applied to specific points at the tip ends of the corner parts and reinforce the circuit board 10 more effectively. In other words, with the reinforcement of the parts near the corner parts of the four corners in the mounted region of the semiconductor device 12, only the parts where the stress is intensively applied can be reinforced.

Figure 5:
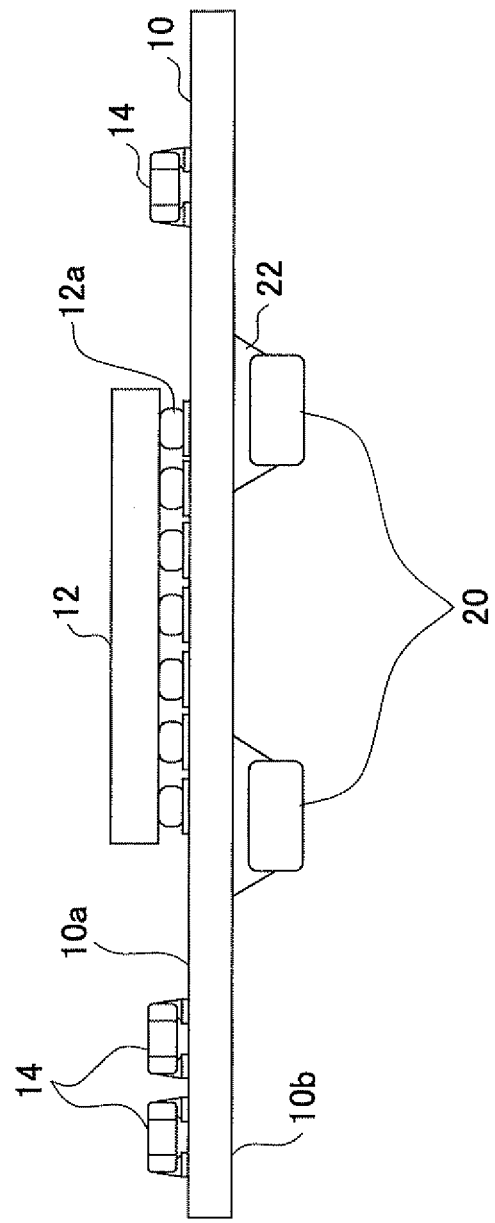
FIG. 5 is a side view of the board assembly to which the reinforcing member according to an embodiment is bonded.

In the embodiment, instead of the reinforcing member 16, four reinforcing members 20 are bonded to the four corners of the mounted region of the semiconductor device 12 to partially reinforce the circuit board 10 as illustrated in FIG. 5. The reinforcing members 20 are bonded to the corner parts of the four corners of the rectangular mounted region of the semiconductor device 12 on the rear surface 10b of the circuit board 10. In the embodiment, the reinforcing members 20 are circles each having a notch 20a. The reinforcing members 20 are arranged such that the notches 20a are directed to an outside on diagonal lines in the mounted region and positioned corresponding to, among those formed by the solder pumps 12a, the bonding parts (solder bumps 12a) at the corners of the mounted region on the diagonal lines.

As described above, the reinforcing members 20 are provided at the parts where the stress is most likely to be intensively applied among those formed by the solder bumps 12a, and the notches 20a of the reinforcing members 20 are directed in directions in which the stress is likely to be intensively applied (in the directions in which the stress is applied to the mounted region of the semiconductor device 12 along the diagonal lines). Accordingly, the stress transmitted to the mounted region of the semiconductor device 12 in the diagonal directions is dispersed at the two mountain parts of the reinforcing members 20 having the notches 20a, which in turn reduces the intensive application of the stress to the bonding parts (solder bumps 20a) at the notches 20. This prevents the stress caused by an external force applied to the circuit board 10 from being excessively intensively applied to the bonding parts (solder bumps 20a) at the notches 20 and can efficiently reduce the occurrence of connection failures.

In the embodiment, the reinforcing members 20 are bonded only to the corner parts of the four corners of the mounted region of the semiconductor device 12. This is because the intensive application of the stress is not so large at parts other than the four corners of the mounted region and thus connection failures at the bonding parts (solder bumps 20a) may hardly occur even if the reinforcing members 20 are not provided.

Figure 6:
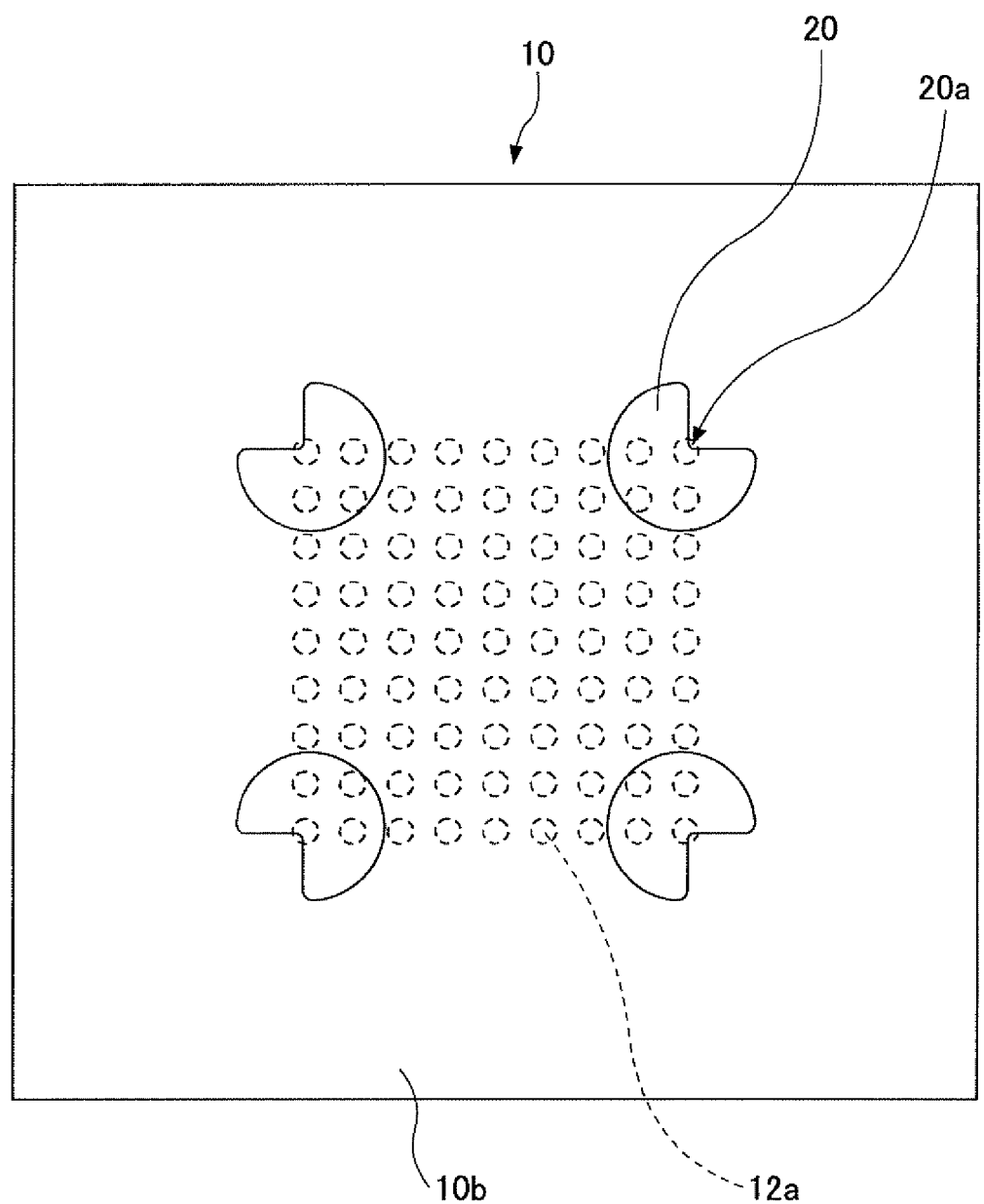
FIG. 6 is a plan view as seen from the side of the rear surface of the board assembly illustrated in FIG. 5.
Figure 7:
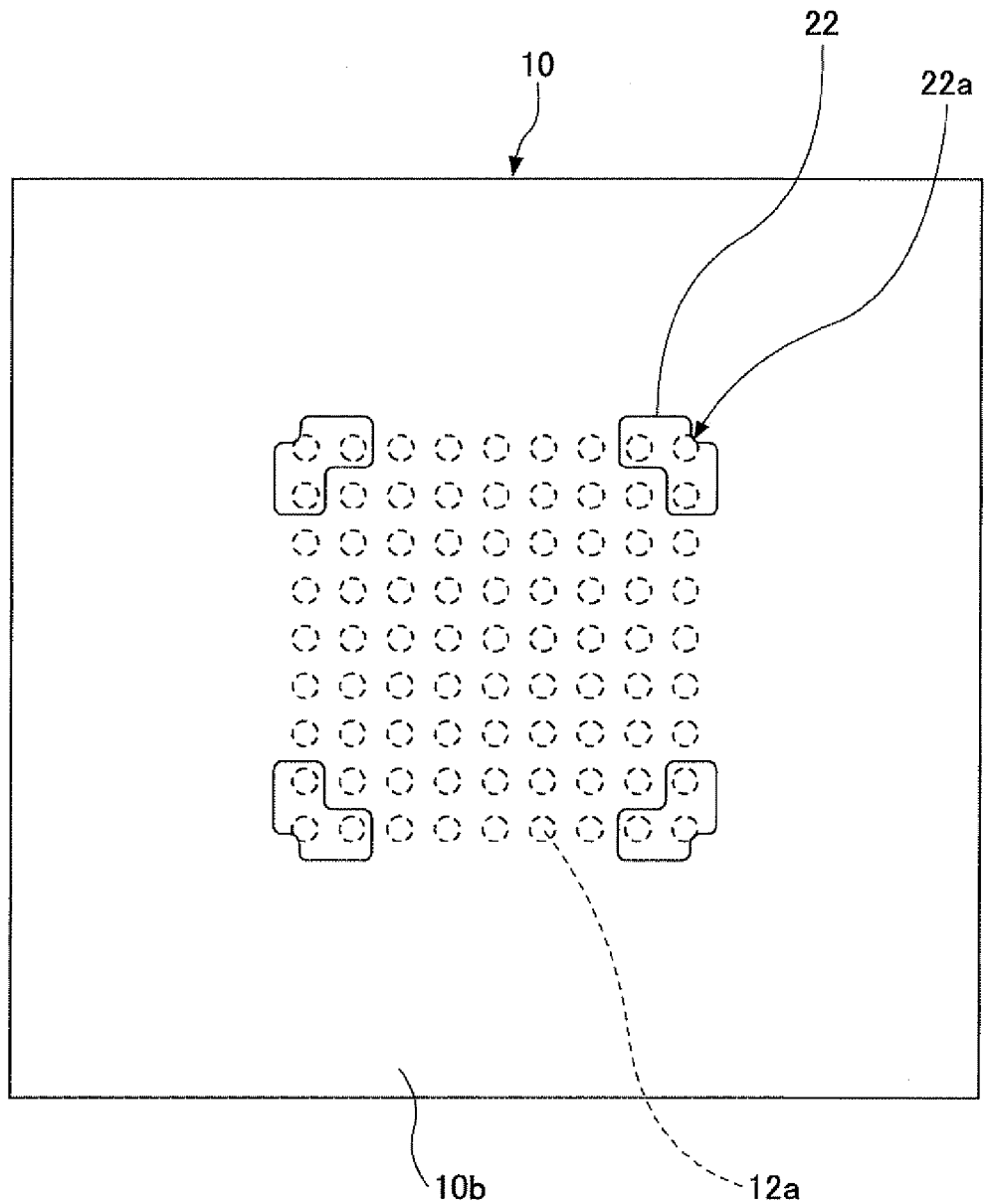
FIG. 7 is a plan view illustrating a modification of the reinforcing member illustrated in FIG. 6.

The shapes of the reinforcing members 20 are not limited to the circles having the notches 20a illustrated in FIG. 6. The reinforcing members 20 may be in any shape like reinforcing members 22 each having a notch 22a illustrated in FIG. 7 and reinforcing members 24 each having a notch 24a illustrated in FIG. 8, so long as they have notches like the notches 20a.

Figure 9:
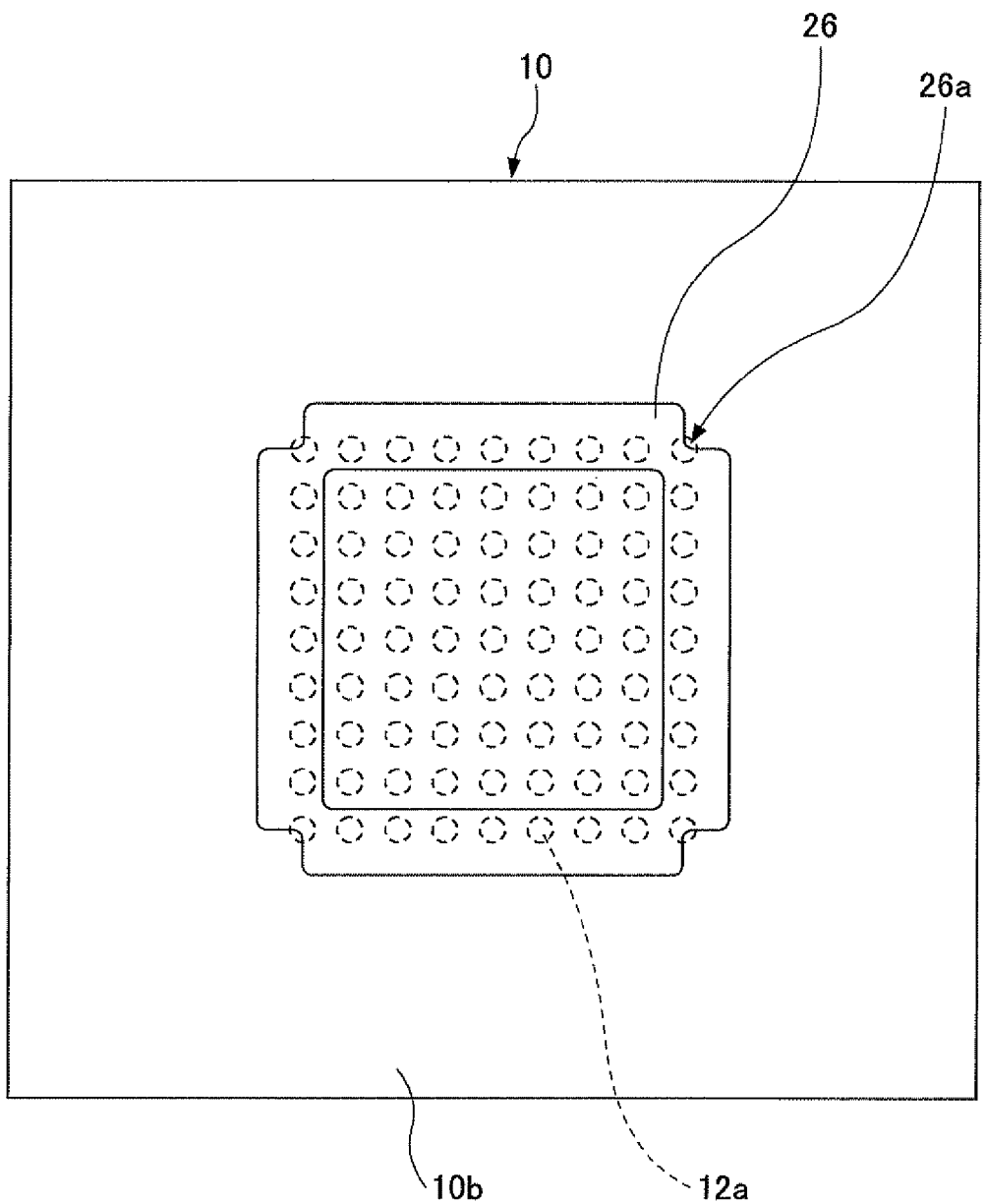
FIG. 9 is a plan view illustrating the reinforcing member formed into a rectangular-frame shape and having notches at four corners.
Figure 10:
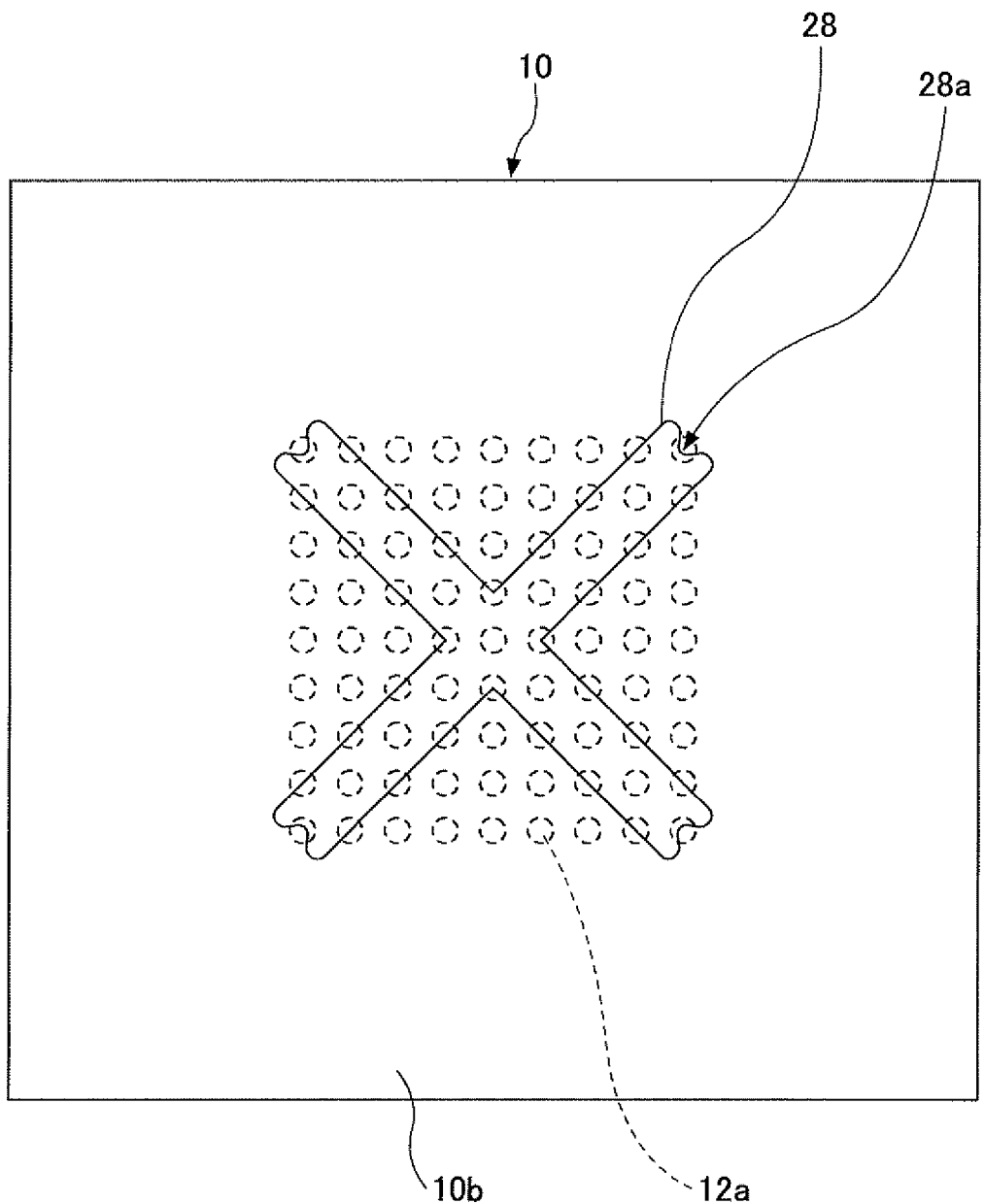
FIG. 10 is a plan view illustrating the reinforcing member formed into a cross shape and having notches at the four corners.

Further, as illustrated in FIG. 9, a rectangular-frame-shaped reinforcing member 26 may be formed to cover the four corners of the mounted region of the semiconductor device 12 and have notches 26a at its four corners. This reinforcing member 26 can reduce the intensive application of stress to the four corners of the mounted region of the semiconductor device 12 while reinforcing the entire periphery of the mounted region of the semiconductor device 12 on the circuit board 10. Furthermore, as illustrated in FIG. 10, a reinforcing member 28 may be formed in a cross shape to extend along the diagonal lines of the mounted region of the semiconductor device 12 and have notches 28a at positions corresponding to the four corners of the mounted region. This reinforcing member 28 can reduce the intensive application of the stress to the four corners of the mounted region of the semiconductor device 12 while entirely reinforcing the mounted region of the semiconductor device 12 on the circuit board 10.

Figure 11:
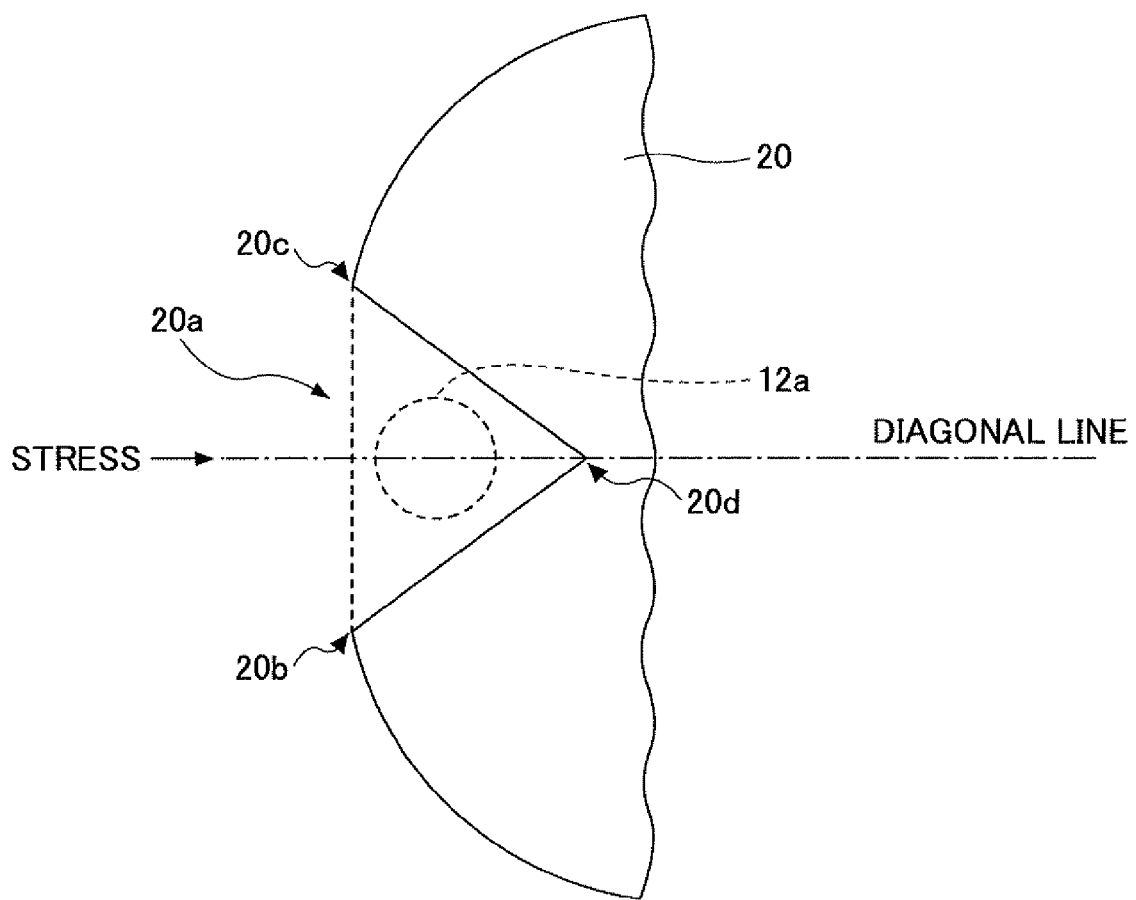
FIG. 11 is a view illustrating the shape of the notch of the reinforcing member and the position of the notch with respect to the solder bump.

Here, a description is made of the shape and position of the notch of the reinforcing member. FIG. 11 is a view illustrating the shape of the notch 20a of the reinforcing member 20 and the position of the notch 20a with respect to the solder bump 12a. As illustrated in FIG. 11, the notch 20a of the reinforcing member 20 has corners 20b and 20c serving as the apexes of the two mountain parts and a corner 20d serving as the bottom of a valley between the corners 20b and 20c. The stress transmitted from the extended direction of the diagonal line in the mounted region of the semiconductor device 12 is dispersed and intensively transmitted to the corners 20b and 20c serving as the apexes of the two mountain parts. Accordingly, in a case where the solder bump 12a is positioned inside the notch 20a, the stress is dispersed and transmitted to the corners 20b and 20c on the both sides of the notch 20a and thus not intensively applied to the solder bump 12a. Accordingly, where the corners 20b and 20c are positioned on the upstream side of the solder bump 12a in the direction in which the stress is transmitted, the stress can be dispersed and intensively applied to the corners 20b and 20c before being transmitted to the solder bump 12a. In other words, the solder bump 12a is only required to be positioned inside a line (as indicated by dotted lines in FIG. 11) connecting the corners 20b and 20c to each other.

The present inventors confirmed effects on the pressure resistance of the above reinforcing members by conducting structure simulations. FIG. 12 is a table illustrating the results of the structure simulations.

In the structure simulations, the shape of the semiconductor device 12 was a square having a side of 27 mm. The circuit board 10 was formed of FR4 as a board material and had a thickness of 1 mm. The reinforcing members were formed of stainless steel (SUS material) or a resin material having a Young's modulus of 10 GPa and had a thickness of 1 mm. Based on the above conditions, an external force of 4 Kg was applied to the circuit board 10 to make its stress transmit to the bonding parts (solder bumps 12a) at the four corners. Here, it was found that the stress not causing the breakage of the bonding parts was 300 N/mm².

In FIG. 12, the simulation No. 1 illustrates the result of the simulation of a structure in which the semiconductor device 12 was merely mounted on the circuit board, the circuit board not being provided with the reinforcing members. In this condition, it was confirmed that the stress transmitted to the bonding parts (solder bumps 12a) was 500 N/mm². The value of the stress greatly exceeded the tolerance 300 N/mm², resulting in the breakage of the bonding parts.

The simulation No. 2 illustrates the result of the simulation of a structure in which the semiconductor device 12 and the circuit board 10 were fixed to each other by an underfill material filled therebetween, the circuit board not being provided with the reinforcing members. In this condition, it was confirmed that the stress transmitted to the bonding parts (solder bumps 12a) was 38.5 N/mm².

The simulation No. 3 illustrates the result of the simulation of a structure in which the square-frame-shaped metal reinforcing member was bonded to the rear surface 10b of the circuit board 10. In this condition, it was confirmed that the stress transmitted to the bonding parts (solder bumps 12a) was 30 N/mm². It was found that the reinforcing member could further reduce the stress transmitted to the bonding parts (solder bumps 12a) than the underfill material did.

The simulation No. 4 illustrates the result of the simulation of a structure in which a resin material formed to be similar in shape to the reinforcing member of the simulation No. 3 was bonded to the rear surface 10b of the circuit board 10. In this condition, it was confirmed that the stress transmitted to the bonding parts (solder bumps 12a) was 160 N/mm². It was found that the stress transmitted to the bonding parts (solder bumps 12a) could be reduced to some extent even if the resin material (having a Young's modulus of 10 GPa) was used instead of the reinforcing member.

The simulation No. 5 illustrates the result of the simulation of a structure in which the cross-shaped metal reinforcing member was bonded to the rear surface 10b of the circuit board 10. In this condition, the stress transmitted to the bonding parts (solder bumps 12a) was 50 N/mm². It was confirmed that the reinforcing member could further reduce the stress transmitted to the bonding parts (solder bumps 12a) than the underfill material did.

The simulation No. 6 illustrates the result of the simulation of a structure in which a resin material formed to be similar in shape to the reinforcing member of the simulation No. 5 was bonded to the rear surface 10b of the circuit board 10. In this condition, it was confirmed that the stress transmitted to the bonding parts (solder bumps 12a) was 200 N/mm². It was found that the stress transmitted to the bonding parts (solder bumps 12a) could be reduced to some extent even if the resin material (having a Young's modulus of 10 GPa) was used instead of the reinforcing member.

Figure 13:
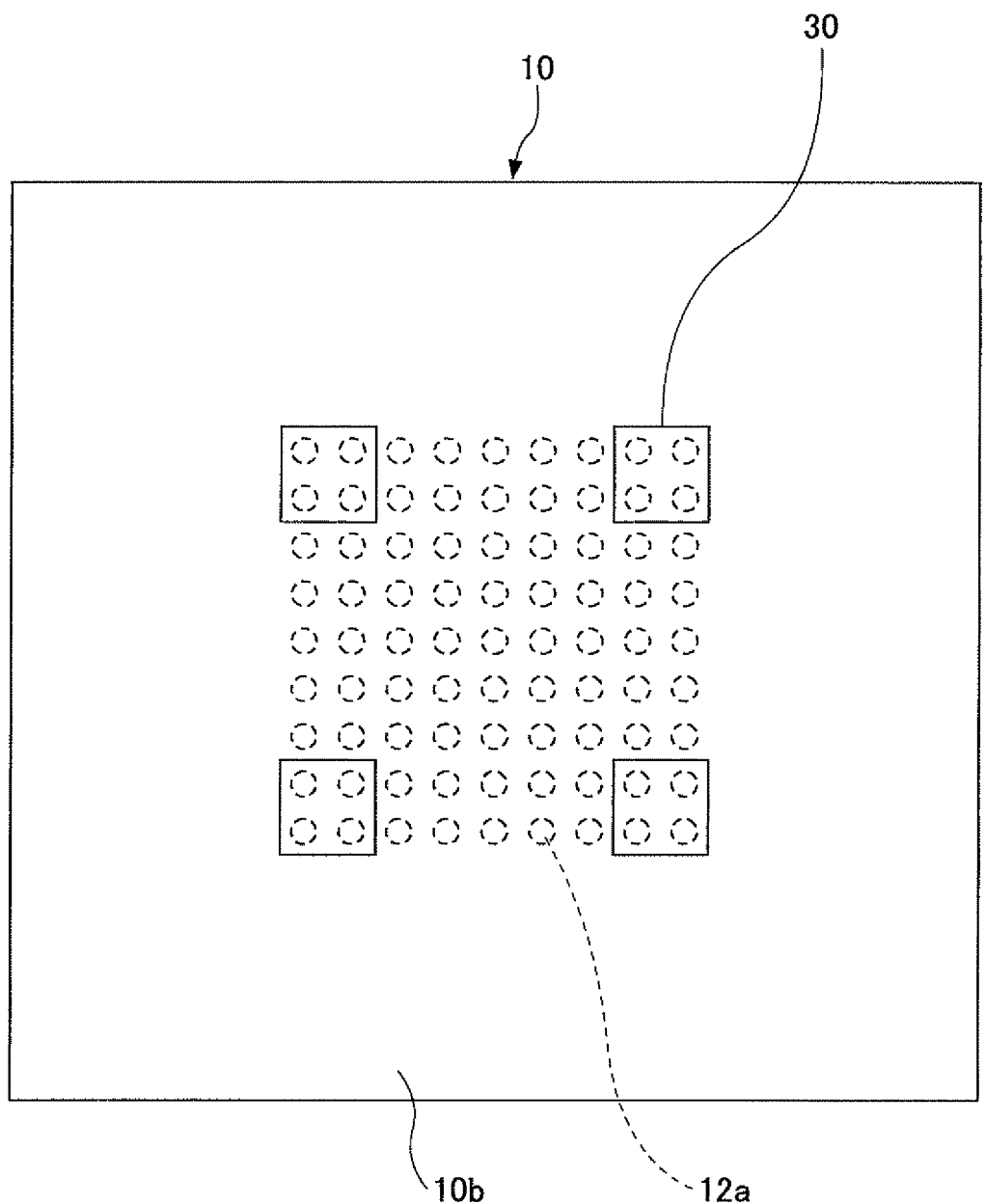
FIG. 13 is a plan view illustrating the reinforcing members for comparison.

The simulation No. 7 illustrates the result of the simulation of a structure in which rectangular metal reinforcing members 30 were bonded to the four corners of the mounted region on the rear surface 10b of the circuit board 10 as illustrated in FIG. 13. In this condition, the stress transmitted to the bonding parts (solder bumps 12a) was 100 N/mm². This simulation was conducted as a comparison with the following simulations.

The simulation No. 8 illustrates the result of the simulation of a structure in which the rectangular reinforcing member 16 having the notches 16a at the four corners was bonded to the rear surface 10b of the circuit board 10 in the mounted region as illustrated in FIG. 4. The outer shape of the reinforcing member 16 was similar in size to the outer shape of the mounted semiconductor device 12. In this condition, it was confirmed that the stress transmitted to the bonding parts (solder bumps 12a) was 18.5 N/mm².

The simulation No. 9 illustrates the result of the simulation of a structure in which the rectangular-frame-shaped reinforcing member 26 having the notches 26 at the four corners were bonded to the rear surface 10b of the circuit board 10 in the mounted region as illustrated in FIG. 9. The outer shape of the reinforcing member 26 was similar in size to the outer shape of the mounted semiconductor device 12. In this condition, it was confirmed that the stress transmitted to the bonding parts (solder bumps 12a) was 28 N/mm².

Figure 8:
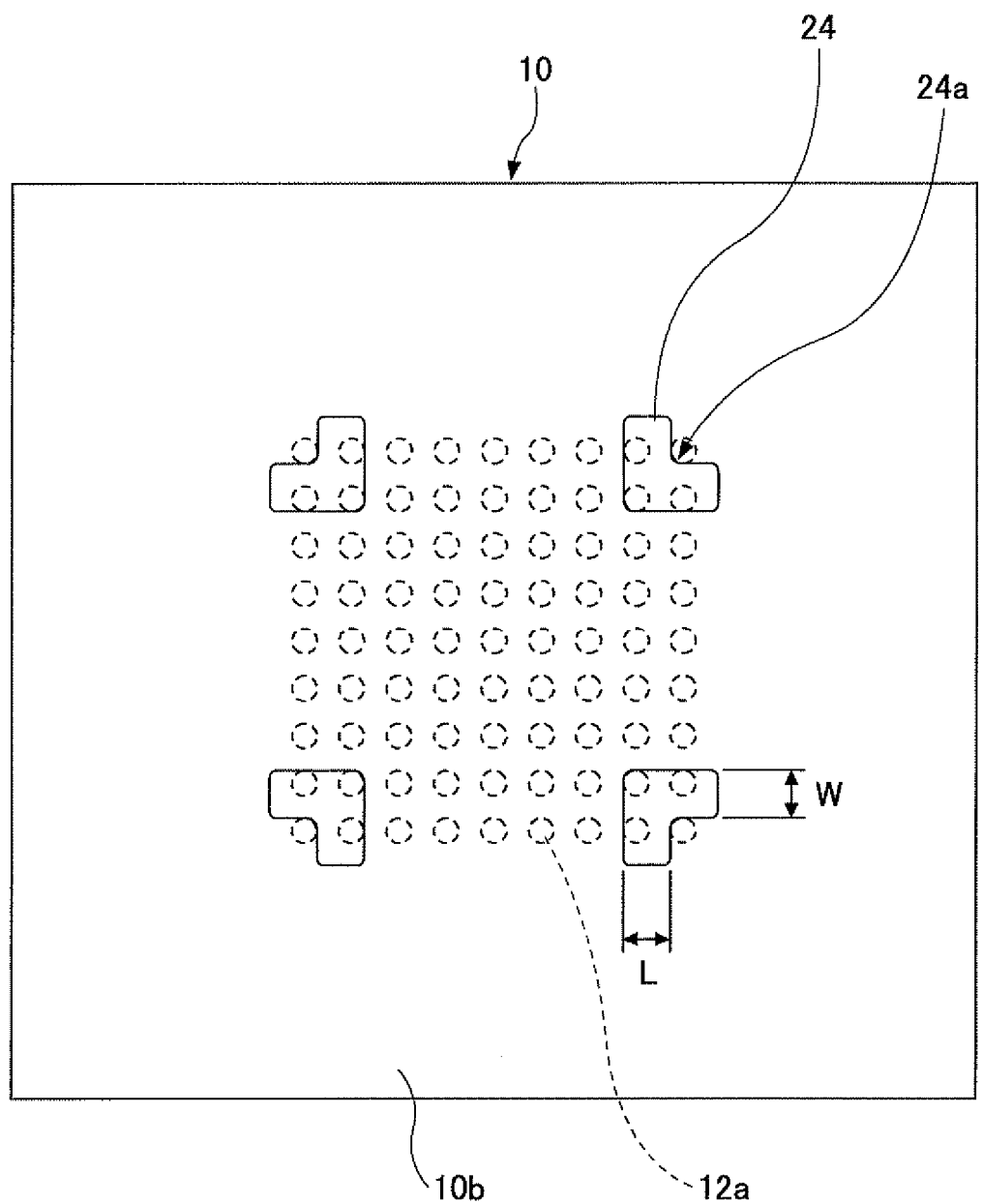
FIG. 8 is a plan view illustrating another modification of the reinforcing member illustrated in FIG. 6.

The simulation No. 10 illustrates the result of the simulation of a structure in which the reinforcing members 24 each having the notch 24a were bonded to the four corners of the mounted region at the rear surface of the circuit board as illustrated in FIG. 8. The length of the notch 24a was 3 mm, and the width of the reinforcing member 24 was 3 mm. In this condition, it was confirmed that the stress transmitted to the bonding parts (solder bumps 12a) was 60 N/mm².

It was clear from the results of the above simulations that the stress transmitted to the bonding parts (solder bumps 12a) was reduced to 100 N/mm² substantially below the tolerance 300 N/mm² of the stress even if the reinforcing members were bonded only to the four corners of the mounted region. In addition, it was found that the stress was further reduced to 60 N/mm² by the rectangular reinforcing members 24 each having the notch 24a. It appears that the reduced amount 40 N/mm² is provided by the dispersion of the stress due to the notches 24a.

Figure 14:
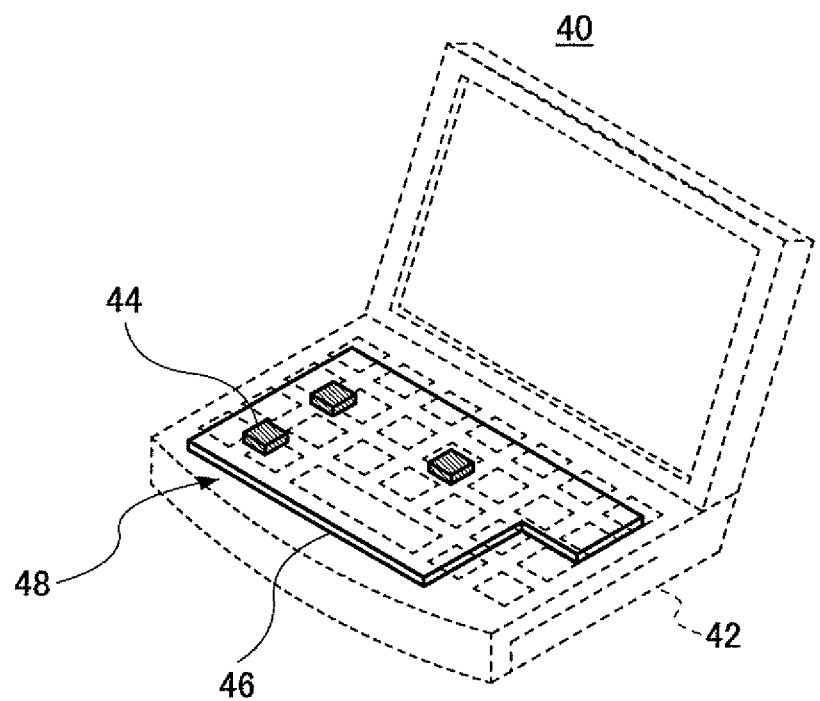
FIG. 14 is a perspective view of a notebook computer that incorporates the board assembly.

The reinforcing members according to the embodiment are used when electronic components such as semiconductor devices are mounted on a circuit board incorporated in an electronic device. FIG. 14 is a perspective view of a notebook computer that incorporates a board assembly having the reinforcing members according to the embodiment.

A main body 42 having the keyboard of the notebook computer 40 incorporates the board assembly 48 in which semiconductor devices 44 are mounted on a circuit board 46. In mounting the semiconductor devices 44 on the circuit board 46, the reinforcing members according to the embodiment are used. Since the notebook computer 40 is thin, a force applied from an outside to the main body 42 is easily transmitted to the circuit board 46 to easily bring the circuit board 46 into a deformed state. Accordingly, the reinforcing members according to the embodiment can disperse the stress transmitted to the bonding parts of a mounting structure and improve the pressure resistance and long-term reliability of the bonding parts between the semiconductor devices 44 and the circuit board 46. Further, the reinforcing members according to the embodiment eliminates the necessity of fixing the semiconductor devices 44 to the circuit board 46 by an underfill material. Consequently, the semiconductor devices 44 can be easily separated from the circuit board 46.

Note that the embodiment is described using solder as a bonding material for mounting the semiconductor devices on the circuit board. However, the bonding material is not limited to solder, and other thermofusion materials may be used. Further, it is preferable that the reinforcing members be formed of metal, ceramic, or the like having high strength and hardness. In the case of bonding the reinforcing members by solder, it is preferable that the front surfaces of the reinforcing members be plated with Sn, Au, Cu, Ag, or the like.

All examples and conditional language recited herein are intended for pedagogical purposes to aid the reader in understanding the present invention and the concepts contributed by the inventor to furthering the art, and are to be construed as being without limitation to such specifically recited examples and conditions, and the organization of such examples in the specification does not relate to a illustrating of the superiority or inferiority of the present invention. Although the embodiment of the present invention has been described in detail, it should be understood that the various changes, substitutions, and alterations could be made hereto without departing from the spirit and scope of the present invention.

What is claimed is:

1. A board reinforcing structure comprising:
a reinforcing member configured to reinforce a circuit board having an electronic component mounted thereon, wherein the electronic component has a plurality of electrodes arranged within a rectangular bonding region on a first surface of the circuit board,
wherein the reinforcing member is bonded on a second surface of the circuit board opposite to the first surface at positions corresponding to four corners of the rectangular bonding region;
wherein the reinforcing member includes a notch formed at a position corresponding each of the four corners of the rectangular bonding region, and
wherein two apexes of the reinforcing member extend outwardly to form the notch from a central part of the rectangular bonding region in a plan view taken in a direction perpendicular to the first surface, and the rectangular bonding region is located inside an imaginary line connecting the two apexes in the plan view.

2. The board reinforcing structure according to claim 1, wherein the plurality of electrodes of the electronic component are bonded to the first surface via a plurality of solder bumps within the rectangular bonding region.

3. The board reinforcing structure according to claim 2, wherein
the reinforcing member has a rectangular frame shape having four corner parts respectively corresponding to the four corners of the rectangular bonding region, and
the rectangular frame shape integrally includes the two apexes forming the notch at each of the four corner parts thereof.

4. The board reinforcing structure according to claim 2, wherein
the reinforcing member has a cross shape extending along diagonal lines of the rectangular bonding region, and
the cross shape integrally includes the two apexes forming the notch at each of four tip end parts thereof.

5. The board reinforcing structure according to claim 2, wherein
the reinforcing member has a rectangular shape identical in size as the rectangular bonding region, and
the rectangular shape integrally includes the two apexes forming the notch at each of four corner parts thereof.

6. The board reinforcing structure according to claim 2, wherein
the reinforcing member comprises four reinforcing pieces provided at the positions corresponding the four corners of the rectangular bonding region, and
each of the four reinforcing pieces of the reinforcing member integrally includes the two apexes forming the notch.

7. The board reinforcing structure according to claim 1, wherein the reinforcing member is bonded to the second surface of the circuit board by solder.

8. The board reinforcing structure according to claim 1, wherein the reinforcing member is bonded to the second surface of the circuit board by a resin adhesive.

9. A board assembly comprising:
a circuit board having a first surface and a second surface opposite to the first surface;
an electronic component having a plurality of electrodes, arranged within a rectangular bonding region on the first surface, and bonded to a plurality of connection terminals provided on the first surface of the circuit board; and
a reinforcing member bonded on the second surface of the circuit board at positions corresponding to four corners of the rectangular bonding region,
wherein the reinforcing member includes a notch formed at a position corresponding to each of the four corners of the rectangular bonding region, and
wherein two apexes of the reinforcing member extend outwardly to form the notch from a central part of the rectangular bonding region in a plan view taken in a direction perpendicular to the first surface, and the rectangular bonding region is located inside an imaginary line connecting the two apexes in the plan view.

10. The board assembly according to claim 9, wherein the plurality of electrodes of the electronic component are bonded to the plurality of connection terminals via a plurality of solder bumps within the rectangular bonding region.

11. The board assembly according to claim 10, wherein
the reinforcing member has a rectangular frame shape having four corner parts respectively corresponding to the four corners of the rectangular bonding region, and
the rectangular frame shape integrally includes the two apexes forming the notch at each of the four corner parts thereof.

12. The board assembly according to claim 10, wherein
the reinforcing member has a cross shape extending along diagonal lines of the rectangular bonding region, and the cross shape integrally includes the two apexes forming the notch at each of four tip end parts thereof.

13. The board assembly according to claim 10, wherein the reinforcing member has a rectangular shape identical in size as the rectangular bonding region, and
the rectangular shape integrally includes the two apexes forming the notch at each of four corner parts thereof.

14. The board assembly according to claim 10, wherein the reinforcing member comprises four reinforcing pieces provided at the positions corresponding to the four corners of the rectangular bonding region, and
each of the four reinforcing pieces of the reinforcing member integrally includes the two apexes forming the notch.

15. The board assembly according to claim 9, wherein the reinforcing member is bonded to the second surface of the circuit board by solder.

16. The board assembly according to claim 9, wherein the reinforcing member is bonded to the second surface of the circuit board by a resin adhesive.

17. An electronic device incorporating the board assembly according to claim 9.

\* \* \* \* \*